(12) United States Patent
Takahashi

(10) Patent No.: US 6,335,537 B1
(45) Date of Patent: Jan. 1, 2002

(54) PROJECTION EXPOSURE APPARATUS AND EXPOSURE METHOD

(75) Inventor: Akira Takahashi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/598,317

(22) Filed: Jun. 21, 2000

Related U.S. Application Data

(63) Continuation of application No. PCT/JP98/05913, filed on Dec. 25, 1998.

(30) Foreign Application Priority Data

Dec. 26, 1997 (JP) .................................................. 9-361485

(51) Int. Cl.$^7$ .................................................. G01B 11/00
(52) U.S. Cl. ........................... 250/548; 356/399; 355/53
(58) Field of Search .................. 250/548; 356/399–401; 355/53, 55

(56) References Cited

U.S. PATENT DOCUMENTS

| | | | | |
|---|---|---|---|---|
| 5,635,722 A | * | 6/1997 | Wakamoto | 250/548 |
| 5,706,091 A | | 1/1998 | Shiraishi | |
| 5,788,229 A | | 8/1998 | Asami et al. | |
| 5,978,069 A | * | 11/1999 | Kato | 355/53 |

FOREIGN PATENT DOCUMENTS

| | | |
|---|---|---|
| JP | 4-324923 | 11/1992 |
| JP | A-5-29196 | 2/1993 |
| JP | A-6-267820 | 9/1994 |
| JP | A-7-37770 | 2/1995 |
| JP | A 8-327318 | 12/1996 |

* cited by examiner

Primary Examiner—Stephone B. Allen
(74) Attorney, Agent, or Firm—Oliff & Berridge, PLC

(57) ABSTRACT

In the projection exposure apparatus of the present invention, alignment controller selects, from baseline memory, the appropriate baseline amount in correspondence with the insertion, into optical axes and in positional detection optical system, of illumination light limiting member and phase plate. In this way, by using a baseline amount corresponding to a modification of the optical conditions, a desired position on substrate is accurately disposed beneath the projection optical system. Furthermore, even when there are changes in the electrical circuit characteristics of the positional detection optical system as a result of changes in the amplification ratio of the amplifier, the alignment controller conducts processing which is identical to that described above. By means of this, even when the characteristics of the positional detection optical system are changed, the baseline amount corresponding to the changes in characteristics is corrected, and reliable alignment is possible.

43 Claims, 6 Drawing Sheets

PROJECTION EXPOSURE APPARATUS AND EXPOSURE METHOD

This is a Continuation of Application No. PCT/JP98/05913 filed Dec. 25. 1998.

TECHNICAL FIELD

The present invention relates to a projection exposure apparatus and exposure method which employ a photolithography process in which a pattern formed in a reticle which is a mask is exposed onto a substrate to which a photosensitive agent has been applied, when manufacturing microdevices such as semiconductor elements, liquid crystal display elements, image picking up devices (CCD), and thin film magnetic heads and the like. In particular, the present invention relates to the correction of the baseline amount, which is one of the operational amounts necessary when conducting the relative positioning of the pattern of the reticle and the substrate.

The present application is based on Japanese Patent Application No. HEI 9-361485, and the contents thereof are incorporated by reference.

BACKGROUND ART

In photolithography processes for manufacturing semiconductor elements or liquid crystal display elements or the like, a projection exposure apparatus is employed which obtains the semiconductor elements or liquid crystal display elements by applying a photosensitive agent onto the surface of a substrate (a semiconductor wafer surface or a liquid crystal glass substrate surface), and exposing, onto the substrate surface, via a projection optical system, the image of a reticle having formed therein a desired element circuit pattern.

As shown in FIG. 11, this projection optical apparatus 1 generally comprises a light source (not depicted in the figures) which emits illumination light for exposure which is irradiated onto a pattern formed in reticle R, a projection optical system P for reduction-projecting the pattern onto the surface of a substrate W, and a stage S for moving the substrate W below the projection optical system P, and the like.

In the photolithography process, during the above-described exposure operation, some sort of stratagem is necessary to align a plurality of shot regions on substrate W with various reticle patterns. In order to respond to this need, alignment marks (marks) A which are associated with each shot region are normally provided on substrate W, and the alignment of the reticle pattern with the regions on the substrate W, that is to say, the positioning thereof, is conducted by detecting these marks using a position detecting optical system Q which is provided separately from the projection optical system P.

As shown in FIG. 11, this position detecting optical system Q is an off-axis optical system having an optical axis QX which is parallel to the optical axis PX of the projection optical system P described above, and comprises an illumination optical part Q1 which irradiates a broadband light (having a wavelength within a range of approximately 550 to 750 nm) onto the alignment mark A, an imaging optical part Q2 into which is inputted the light generated by the illumination of the alignment mark A, and which forms an image of the alignment mark A on image pickup element Qc, and image processing part Q3 which is connected to the image pickup element Qc. In imaging optical part Q2, an index plate Qk which is provided with index marks is provided in the optical path, and an image of the index marks of this index plate Qk is formed on the image pickup element Qc. The image processing part Q3 detects the amount of positional displacement between the image of the index marks formed on the image pickup element Qc and the image of the alignment marks A. An alignment controller (not depicted in the figure) conducts positioning by moving the stage S based on this amount of positional displacement and the position of the stage S which is detected by a laser interferometer during the image pickup of alignment marks A.

In alignment such as that described above, an operational amount, termed a baseline amount, is generally required, and this is obtained in the manner described below. Now, the reference mark FM which is formed on the stage S is detected by the positional detection optical system Q. At this time, the amount of positional displacement with the image of the index marks on index plate Qk is detected, and the position of stage S during the detection of the reference mark FM is determined. Furthermore, based on the amount of positional displacement and the position of stage S, the position X1 of stage S when the amount of positional displacement is 0 is determined. This position X1 is stored in the storage region of an alignment controller, which is not depicted in the figure, of projection exposure apparatus 1.

Next, the stage S is moved so that the reference mark FM is essentially directly beneath the projection optical system P, or in other words, so that the reference mark FM is disposed at a position conjugate with the reticle marks Rm via projection optical system P. An image of the reticle marks Rm and an image of the reference mark FM projected by the projection optical system P are formed on the image pickup element of an alignment optical system (not depicted in the figure) which is disposed above the reticle R. Additionally, the reticle marks Rm form a reference during alignment. The alignment optical system detects the amount of positional displacement of these two mark images. The alignment controller determines the position X2 of the stage S when the amount of positional displacement is 0, based on the amount of positional displacement and the position of stage S as determined by a laser interferometer. This position X2 which is thus determined is stored in the storage region of the alignment controller described above.

The baseline amount B is obtained using position X1 and position X2, which relate to the stage and which were determined as described above; the baseline amount B is equal to X2−X1.

When the image of the reticle pattern is transferred onto a shot region on substrate W, the alignment mark A belonging to this shot region is detected by the positional detection optical system Q and the position thereof is determined, and the stage S is moved based on this determined position and the baseline amount B described above. By means of this, the image of the reticle pattern Rm is accurately aligned with the shot region.

In this way, the baseline amount B is an operational amount which is extremely important in the photolithography process, and a strictly accurate measured value thereof is required. However, here, there are a number of difficult problems which need to be solved.

For example, when semiconductor elements are manufactured, a number of types of semiconductor wafers having different reflectances and the like are employed, and the thin films or optical characteristics of the plurality of layers layered on these semiconductor wafers also differ. Furthermore, the alignment marks which are formed on these layers together with the circuit patterns themselves may change in shape in the process of etching and the like. Accordingly, it is difficult to always precisely detect the position of the alignment marks using the same positional detecting optical system irrespective of the type of semiconductor wafer or layer or the like.

In order to take account of this state of affairs, there have been proposals to increase the detection accuracy of the alignment mark image by improving the positional detection optical system Q, as disclosed in Japanese Patent Application, First publication, No. HEI 8-327318 and the corresponding U.S. Pat. No. 5,706,091. The direct problem to be solved in the above application relates to the fact that, as a result of the flattening process of the semiconductor wafers, changes in the unevenness of the alignment mark provided on the wafer become extremely small, and as a result, the detection of the mark becomes difficult.

In order to solve this problem, as shown in FIG. 11, the invention disclosed in the documents described above is provided, in the illumination optical part Q1 and the imaging optical part Q2 of the positional detection optical system Q, with an illumination light limiting member q1 and a phase plate q2 which may be inserted into or withdrawn from the optical path, and by changing the optical characteristics within the positional detection optical system Q, the detection of the image in image pickup element Qc is conducted in a satisfactory manner.

In a positional detection optical system Q such as that described above, it is possible to arrive at the detection of the alignment mark in a satisfactory and certain manner. However, in this case, by disposing the illumination light limiting member q1 and the phase plate q2 on the optical axis, the optical characteristics of the positional detection optical system Q are changed, and this has an effect on the accuracy of alignment. Here, concrete examples of modifications in the optical characteristics include those in which shifts are produced in the optical axis. That is to say, an offset (detection error) is produced in the measured value of the positional detection optical system Q. Now, if the baseline amount when members q1 and q2 are not inserted into the optical path is represented by B, then between this amount B and a baseline amount B' which results when the members are inserted into the optical axis, an amount of displacement is produced such that B'=B+ΔB (where ΔB does not equal 0). Accordingly, even if the substrate W is moved in accordance with a baseline amount B measured prior to the insertion or removal of the members q1 and q2, it is not possible to accurately align the shot region on the substrate W with the reticle pattern.

Furthermore, an amount of displacement related to the baseline amount, such as the ΔB described above, may be produced even by changes in the characteristics of the electrical circuits in the image processing system Q3. For example, in this image processing system Q3, a signal amplifier is normally disposed; however, changes in the amplification factor of this signal amplifier may produce an amount of displacement Δb. By means of this, the baseline amount B which was previously measured, receives a displacement, and the value thereof becomes B", which equals B+Δb. Accordingly, by means of this, as well, it becomes impossible to accurately align the shot region on the substrate W with the reticle pattern.

DISCLOSURE OF THE INVENTION

The present invention was created in light of the above circumstances; it has as an object to provide a projection exposure apparatus which makes it possible, even where the characteristics of the positional detection optical system have changed, to correct the baseline amount in correspondence with this change in characteristics, and to accurately conduct alignment. Furthermore, it has as object of the present invention to provide an exposure method which permits the overlapping transfer of reticle patterns onto circuit patterns (shot regions) formed on a substrate, with constant good accuracy, even when the mark detection conditions of the positional detection optical system change.

In order to attain the above object, the projection exposure apparatus in accordance with the present invention is a projection exposure apparatus in which marks on a substrate are detected by a positional detection optical system, the positional relationships between a substrate and a mask are adjusted based on a baseline amount and the results of this detection, and an image of a pattern on the mask is projection-exposed onto the substrate by a projection optical system. This apparatus comprises a first modification device for modifying the optical characteristics of said positional detection optical system, and a baseline correction device for correcting the baseline amount in accordance with the modification of the optical characteristics by the first modification device.

In accordance with this apparatus, each time the optical characteristics of the position optical system are modified by the first modification device, the correction of the baseline amount is conducted by the baseline correction device. That is to say, with respect to the optical characteristics of the positional detection optical system in all the variously modified states which are contemplated, the proper corresponding baseline amount is applied, and it is possible to execute reliable alignment. By means of this, it is possible to provide products of higher quality in semiconductor elements and the like which are manufactured by a photolithography process.

In another aspect of the present invention, a signal processing system, which is connected to the positional detection optical system, and a second modification device, which modifies the electrical circuit characteristics of the signal processing system, are further provided and the baseline correction device corrects the baseline amount in accordance with at least one of the modification of the optical characteristics and the modification of the electrical circuit characteristics.

Another aspect of the present invention is a projection exposure apparatus in which a mark on a substrate is detected by a positional detection optical system, and after aligning the position of the substrate and a mask based on the baseline amount from the detection results, the image of a pattern of the mask is projection-exposed onto the substrate by a projection optical system. This projection exposure apparatus comprises a second modification device which modifies the electrical circuit characteristics of the positional detection optical system, and a baseline correction mechanism which corrects the baseline amount in accordance with the modification of the electrical circuit characteristics by the second modification device.

In accordance with this aspect, each time the electrical circuit characteristics of the position optical system are modified by the second modification device, the correction of the baseline amount is conducted by the baseline correction mechanism. That is to say, with respect to the electrical circuit characteristics of the positional detection optical system, a variety of modified states of which may be contemplated, the proper corresponding baseline amount is applied, and it is possible to conduct reliable alignment.

Another aspect of the present invention is characterized in that at least one of a phase plate and a partial shielding plate which may be inserted and retracted with respect to the optical axis of the positional detection optical system is employed as the first modification device.

In accordance with this aspect, as a result of the modification of the optical characteristics by at least one of the phase plate and the partial shielding plate, it is possible to increase the accuracy of detection of the mark. By means of this, the optical characteristics of the positional detection optical system also receive modification, and the baseline amount is modified in comparison with the state prior to insertion of the phase plate and the partial shielding plate; however, this is corrected by the baseline correction mechanism. Accordingly, it is possible to execute reliable alignment.

The second modification device may modify the amplification factor of the mark detection signal. In accordance with this, by means of the modification of the amplification factor of the mark detection signal, it is possible to increase the accuracy of detection of the mark. In this case, the electrical circuit characteristics of the positional detection optical system also undergo modification, and the baseline amount is modified in comparison with the state prior to undergoing amplification; however, this is corrected by the baseline correction mechanism.

The baseline correction mechanism may measure the baseline amount after modification based on the modification of the optical characteristics conducted by the first modification device or based on the modification of the electrical circuit characteristics conducted by the second modification device. In this case, in the modification of each set of characteristics, it is possible to first obtain the accurate baseline amount for each characteristic modification from a measurement of the baseline amount corresponding to the modification, and thus to conduct alignment. By means of this, when the baseline amount is measured for different characteristic modifications, it is possible to conduct accurate exposure operations.

The baseline correction mechanism may comprises a storage unit for storing in advance the correctional values for each baseline amount based on the modification of the optical characteristics conducted by the first modification device or based on the modification of the electrical circuit characteristics conducted by the second modification device, and a control unit which detects the modification conducted by the first modification device or the modification conducted by the second modification device and which obtains the correction value corresponding to the modification from the storage unit.

In this case, a plurality of baseline correction values corresponding to the various conceivable modifications of characteristics are prepared together in advance, and thereby, during alignment, the most appropriate baseline correction value is selected from among these, and then alignment is conducted. Accordingly, it is not necessary to individually measure the baseline amount for each modification of characteristics, and it becomes possible to rapidly conduct operations. Accordingly, it is not merely possible to realize highly accurate exposure operations, but simultaneously to increase throughput.

The exposure method in accordance with the present invention is a method in which a mark formed on a substrate is detected by a mark detection system, the relative position of an exposure beam emitted from a mask and the substrate is adjusted based on the results of this detection, and the substrate is exposed by this exposure beam. This method comprises modifying the detection conditions of the mark on the substrate by the mark detection system, and based on the detection errors of the mark detection system produced in accordance with the modification of the detection conditions, performing adjustment of the relative positions of the exposure beam and the substrate after modification of the detection conditions.

In accordance with this method, even after modification of the mark detection conditions in the mark detection system, adjustment of the relative positions of the exposure beam and the substrate is conducted based on the detection errors generated in accordance with the modification of the detection conditions, so that an image of the pattern of the mask can be projected onto the appropriate shot region. Accordingly, exposure onto the substrate is conducted accurately, and it is possible to obtain high quality products.

It is also possible to modify the detection conditions by modifying at least one of the intensity distribution of the illumination light, which is irradiated onto the mark on the substrate within the mark detection system, and the imaging characteristics of the light generated from the mark by the irradiation of the illumination light. In this case, what is meant by the modification of the detection conditions is modification of at least one of the intensity distribution of the illumination light irradiated onto the mark and the imaging characteristics of the light emitted from the mark, and by appropriately adjusting these, it is possible to increase the accuracy of detection of the mark. Mechanisms such as, for example, orbicular zone illumination, total illumination, or the like are contemplated for the modification of the intensity distribution of the illumination light. The meaning of this is that the state of the reflected light or diffracted light emitted from the mark is modified. Furthermore, methods such as, for example, the production of phase difference at a certain position in the cross section of the beam are contemplated for the modification of the imaging characteristics of the light emitted from the mark.

In order to compensate for fluctuations in the baseline amount of the mark detection system as a result of errors in detection, the baseline amount of the mark detection system which is employed in the adjustment of the relative positions of the baseline amount exposure beam and the substrate may be corrected in accordance with the detection conditions after modification.

Including the detection errors produced as a result of modifications in the detection conditions, the baseline amounts of the mark detection system are calculated in advance for each set of detection conditions, and it thus becomes possible to execute the adjustment of the relative position based on the baseline amounts corresponding to the detection conditions after the modification of the detection conditions.

In this case, after the inclusion of the detection errors generated as a result of the modification of the detection conditions, the individual baseline amounts corresponding thereto are determined in advance, and the baseline amounts corresponding to the individual modifications of detection conditions are applied in adjusting the relative positions of the exposure beam and the substrate, so that alignment may be executed rapidly without delays. Accordingly, not only are highly accurate exposure operations realized, but there is also the prospect that throughput will simultaneously increase.

BRIEF DESCRIPTION OF THE DRAWINGS

FIG. 4 is a front view, while FIG. 5 is a cross-sectional view.

FIG. 7 is a front view, while FIG. 8 is a cross-sectional view.

BEST MODE FOR CARRYING OUT THE INVENTION

Figure 11:
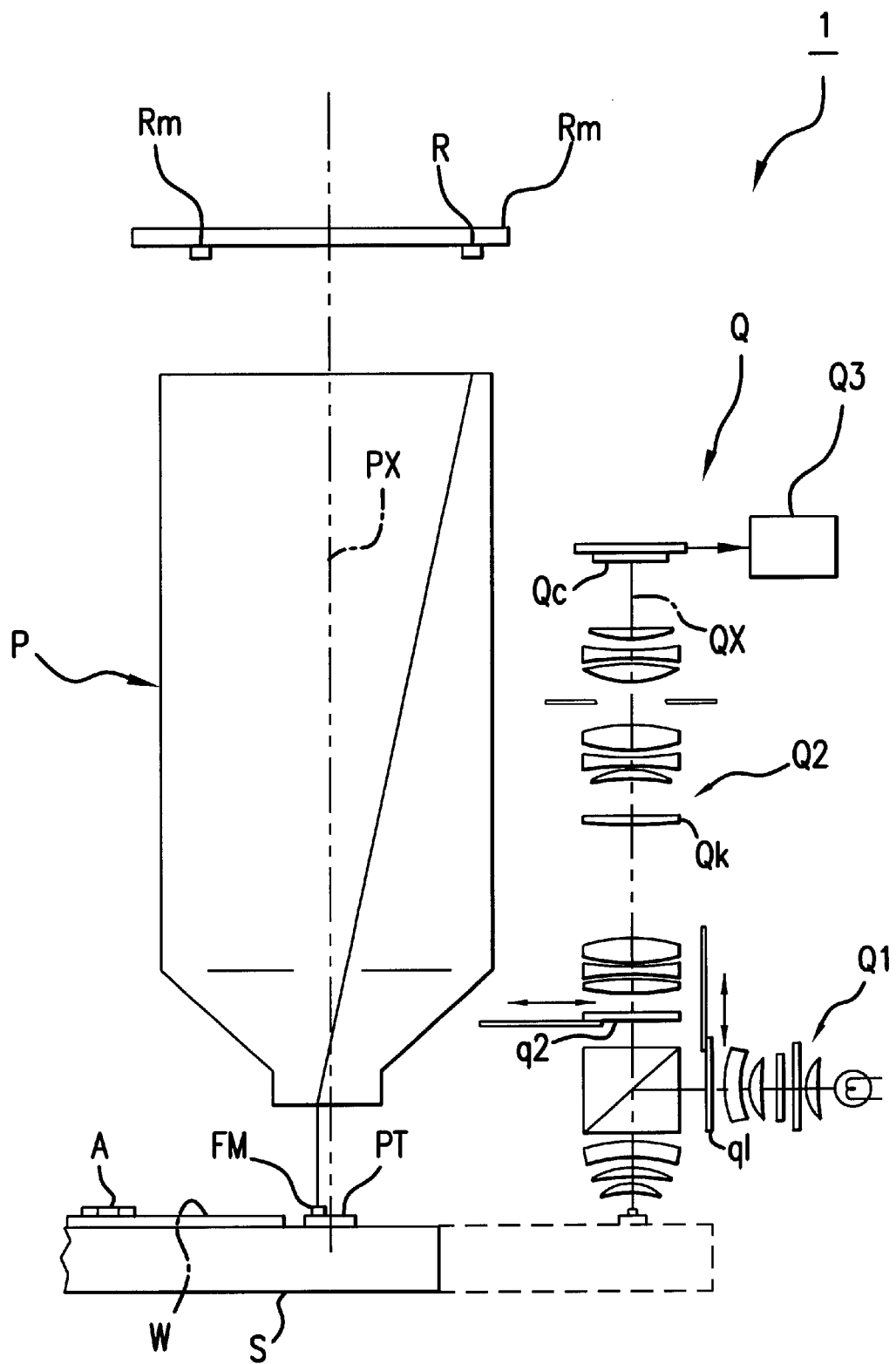
FIG. 11 is an explanatory diagram showing a conventional projection exposure apparatus.

Hereinbelow, an embodiment of the present invention will be explained in detail with reference to FIGS. 1 to 10. With respect to the references in the figures which are referred to in the explanation given hereinbelow, those which indicate the same objects as in the explanation of the background art (FIG. 11) are given identical references. Furthermore, the present invention is not necessarily limited to these embodiments; it is of course that the structural elements of these embodiments may be appropriately combined.

Figure 1:
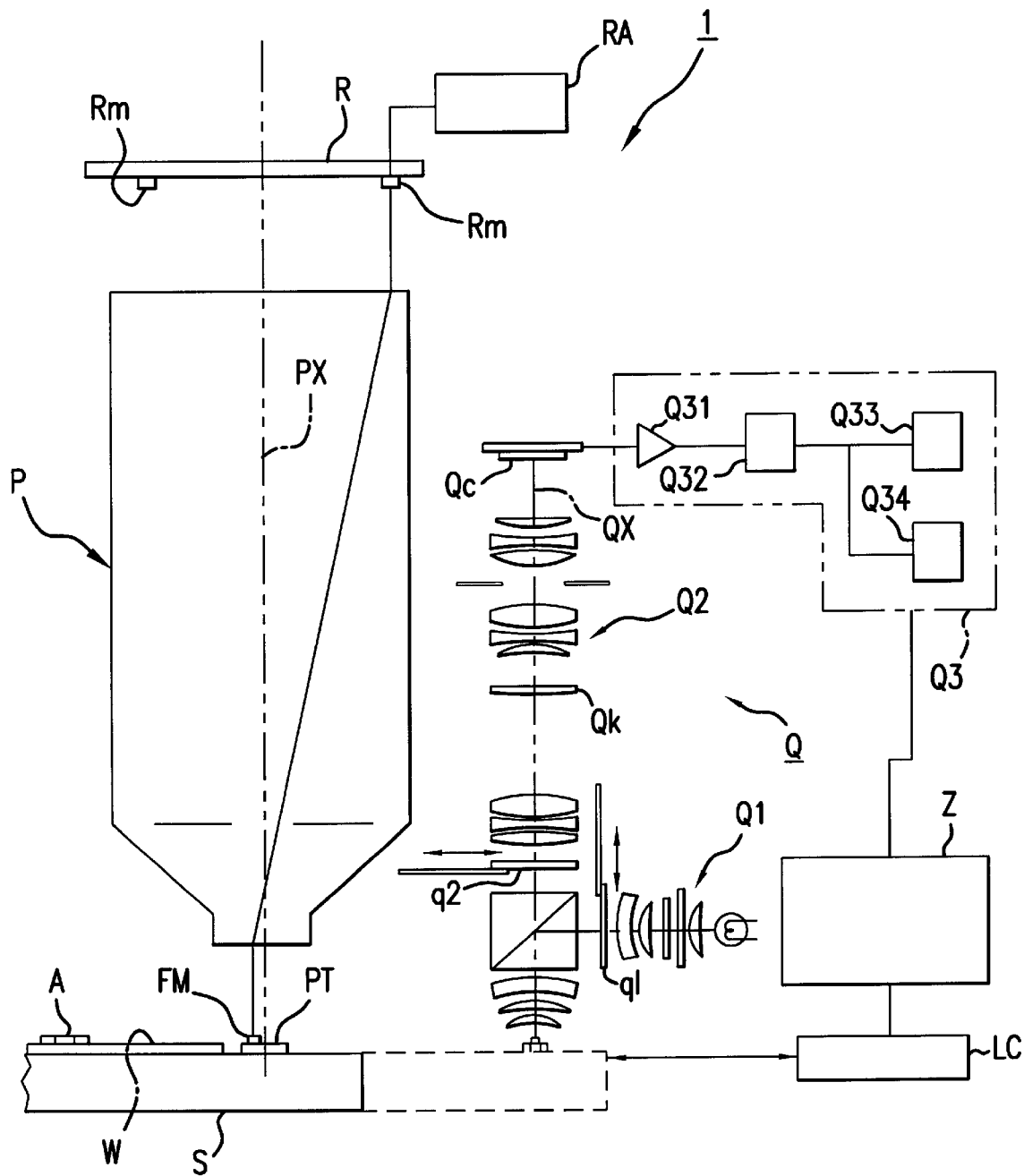
FIG. 1 is an explanatory diagram showing a projection exposure apparatus in accordance with the present embodiment.
Figure 2:
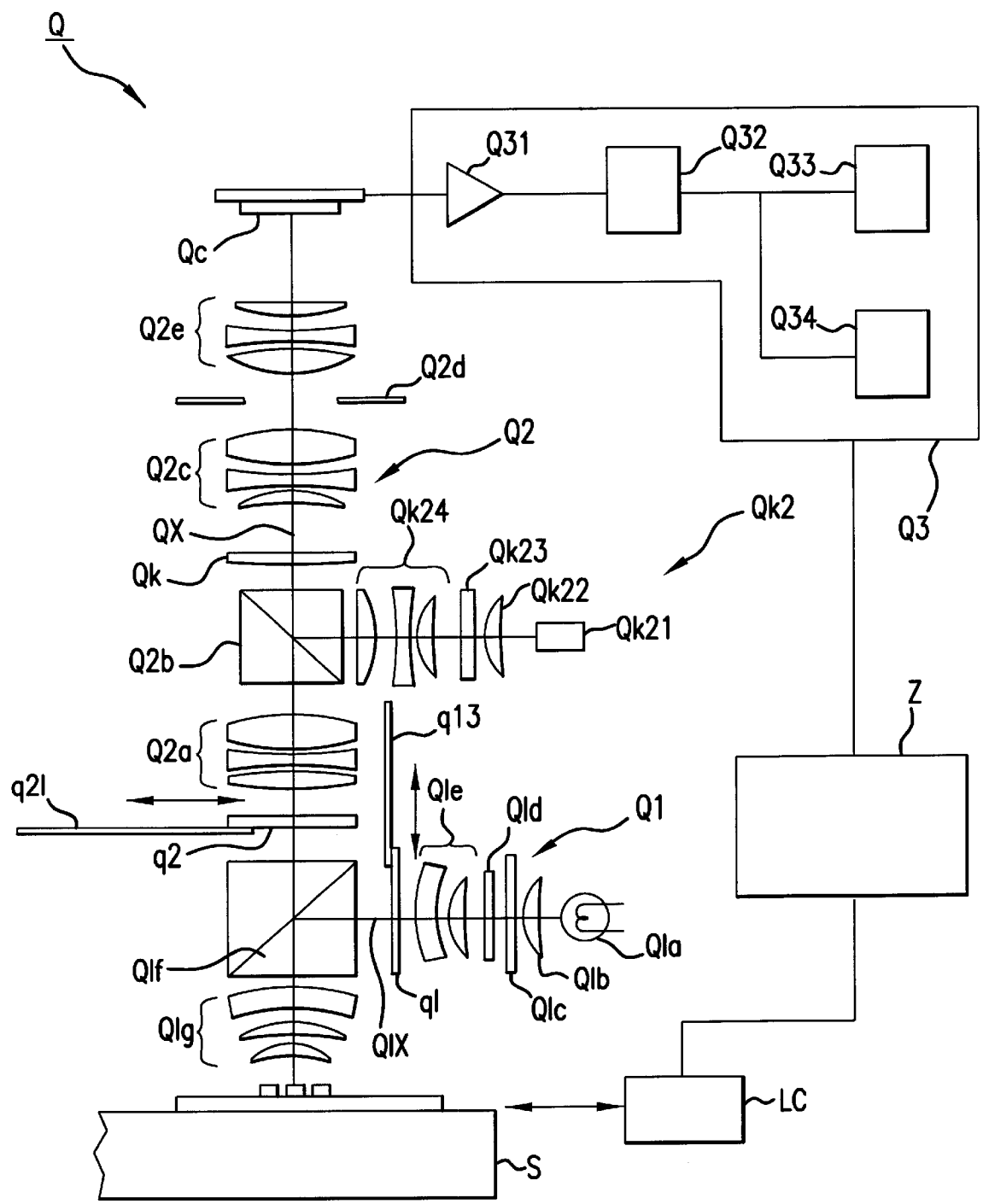
FIG. 2 is an explanatory diagram showing in expanded format the positional detection optical system of the projection exposure apparatus shown in FIG. 1.

FIG. 1 shows a projection exposure apparatus 1 in the present embodiment, while FIG. 2 shows in expanded format a positional detection optical system (mark detection system) Q of an off-axis type in FIG. 1. This positional detection optical system Q generally comprises, as described above, an illumination optical part Q1, an imaging optical part Q2, and an image processing part Q3. Hereinbelow, the structure of each of these parts will be explained.

Illumination optical part Q1 is provided with an illumination light source Q1a, a condenser lens Q1b, a wavelength selection element Q1c, an illumination field stop Q1d, and a relay lens Q1e. Among these, a light source which generates broadband illumination light (broadband light) such as a halogen lamp or the like is employed as illumination light source Q1a. Furthermore, wavelength selection element Q1c only permits the passage of wavelength bands of light to which the photoresist (photosensitive agent) applied to the substrate W is insensitive. The 550 to 750 nm range, for example, may be selected as the insensitive wavelength band of the photoresist. However, if the present invention is applied to the positional detection of a substrate W which is not covered with a photoresist, the restriction of the wavelength band described above is not necessary. Furthermore, if an alignment mark A is formed for each layer, the wavelength may be in the sensitive wavelength band, the wavelength breadth thereof may also be freely selected, and either monochromatic light or semi-monochromatic light may be employed. In the figure, an optical axis Q1X which extends from the illumination light source Q1a to the substrate W is depicted. Furthermore, the illumination field stop Q1d is a variable stop in which it is possible to modify at least one of the shape and size of the opening thereof, and within illumination optical part Q1, the alignment mark A on substrate W is provided in a plane which is essentially conjugate with the focal plane of an objective lens Q1g which is discussed hereinbelow. Accordingly, the image of the opening of the illumination field stop Q1d is projected onto the substrate W by a system combining a relay lens Q1e and the objective lens Q1g. In other words, the detection region of alignment mark A by positional detection optical system Q is determined by the opening of the illumination field stop Q1d.

In illumination optical part Q1, in addition to the structure described above, an illumination light limiting member (partial shielding plate) q1 is provided in a plane (hereinbelow referred to as the illumination system pupil plane) which is in the relationship of an optical Fourier transform with respect to the surface of the substrate W. This is provided so that, by means of its function in concert with the phase plate q2, the detection conditions of the alignment mark A on substrate W and the reference mark FM on stage S are modified and thus the accuracy of the image recognition of the marks is increased. Both members q1 and q2 described above correspond in the present embodiment to the first modification device which modifies the optical conditions. The first modification device is not necessarily limited to the members q1 and q2 described above; members which modify the intensity distribution (at least one of the shape or size) in the illumination system pupil plane of the illumination light irradiated onto alignment mark A, or members which modify the imaging characteristics of the light emitted from alignment mark A as a result of the irradiation of the illumination light, may be employed. Furthermore, the first modification device may comprise only one or the other of members q1 and q2.

Figure 3:
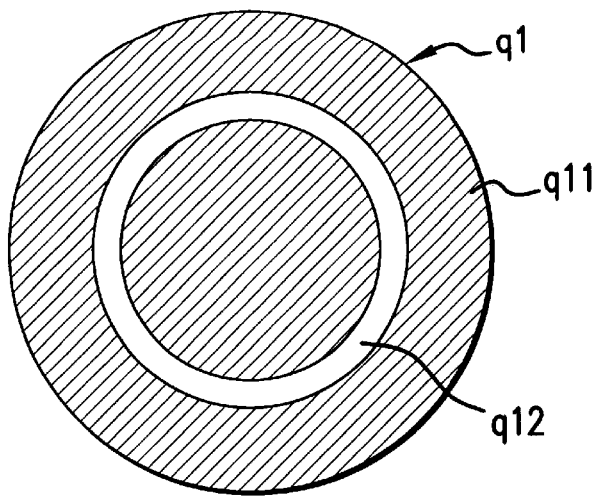
FIG. 3 is a front view showing an illumination light limiting member employed in the projection exposure apparatus shown in FIG. 1.

As shown in FIG. 3, illumination light limiting member q1 has an annular opening q12 formed in the flat surface comprising the darkening member q11. Accordingly, the purpose of the actual function of the illumination light limiting member q1 is to limit the passage of light emitted from the illumination light source Q1a and to illuminate in an annular fashion the alignment mark A and the like on the substrate W. However, this illumination light limiting member q1 is supported by a moveable member q13, and depending on the surface state on the surface of the substrate W, this may be inserted into or withdrawn from the optical axis Q1X. Accordingly, in the state in which the illumination light limiting member q1 is withdrawn from the optical axis Q1X, normal illumination is conducted with respect to the substrate W. That is to say, the illumination light limiting member q1 has the function of modifying the intensity distribution in the illumination system pupil plane of the illumination light irradiated onto the alignment mark Al. For example, a plurality of illumination light limiting members in which at least one of the shape and size of the opening differ may be provided on moveable member q13, and one illumination light limiting member selected in accordance with the type of substrate or resist or the formation conditions of the alignment mark (the including the shape, step, or the like) may be disposed in the optical path of the illumination light part Q1.

In illumination light part Q1, a beam splitter Q1f and an objective lens Q1g are provided along the direction of travel of the light at a position beyond the illumination light limiting member q1. By means of this, the light beam emitted from the illumination light source Q1a is irradiated onto substrate W. The beam splitter Q1f and the objective lens Q1g are provided on optical axis QX of imaging optical part Q2.

Next, the imaging optical part Q2 will be explained. In the order in which the light reflected from the surface of the substrate W proceeds, the structure thereof is such that, first, the objective lens Q1g and the beam splitter Q1f are disposed, and beyond these, a phase plate q2, a relay lens Q2a, a beam splitter Q2b, an index plate Qk, a relay lens Q2c, an illumination light limiting stop Q2d, a relay lens Q2e, and an image pickup element Qc are disposed.

As described above, phase plate q2 has the function, in concert with the illumination light limiting member q1, of increasing the accuracy of detection of the alignment marks, particularly of low steps. This phase plate q2 is provided in a plane (hereinbelow referred to as the imaging system pupil plane) which is in an optical Fourier transform relationship with the substrate W. Accordingly, the phase plate q2 and the illumination light limiting member q1 are mutually conjugate (imaging relationship). Furthermore, this phase plate q2 is supported by a moveable member q21, and in the same manner as the illumination light limiting member q1, this may be inserted into and withdrawn from the optical axis QX.

Figure 4:
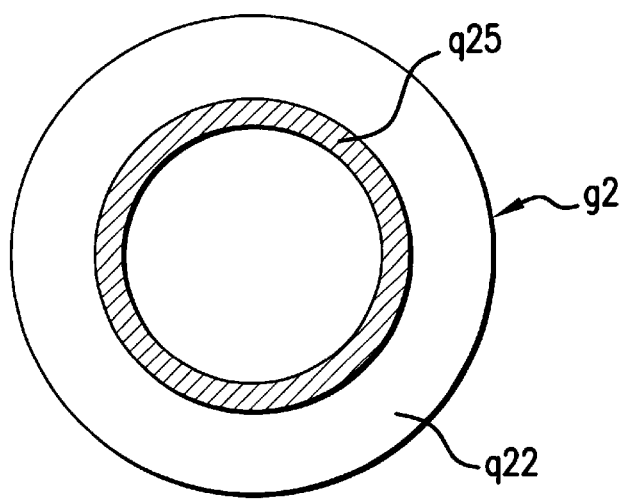
FIGS. 4 and 5 show the phase plate employed in the projection exposure apparatus shown in FIG. 1.
Figure 5:
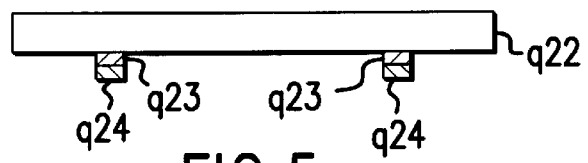

As shown in FIGS. 4 and 5, phase plate q2 has an annular-shaped part q25 having a multilayered structure in which a metal thin film q23 and a dielectric film q24 are laminated, formed in a flat surface comprising a transparent body (a glass plate such as silica or the like) q22. This annular-shaped part q25 is formed at a position which is conjugate with the annular opening q12 of the illumination light limiting member q1. Accordingly, the phase plate q2 has the function of conducting phase shifting with respect to the zero order diffracted light emitted from the substrate W by the operation of this annular-shaped part q25. Concretely, the amount of light transmitted is limited by the metal thin film q23, and the phase of the transmitted light is shifted by the dielectric film q24. By means of this, the light from the substrate W is such that a phase difference is produced between the light passing through the annular-shaped part q25 in the phase plate q2 and the light passing through other regions. This type of structure is the same as a phase difference filter in a conventionally known phase contrast microscope, and by providing this in the illumination optical system Q2, it is possible to increase the accuracy of detection by modifying the imaging conditions of the alignment mark A. The film thickness of the dielectric film q24 may be appropriately determined in accordance with the index of diffraction n and the wavelength $\lambda$ of the light source. A thickness $t=\lambda/(4(n-1))$ obtaining a phase difference of $\pi/2$ (rad) may be used as an example. It is not absolutely necessary to provide the metal thin film q23 which serves to limit the amount of light transmitted.

Figure 6:
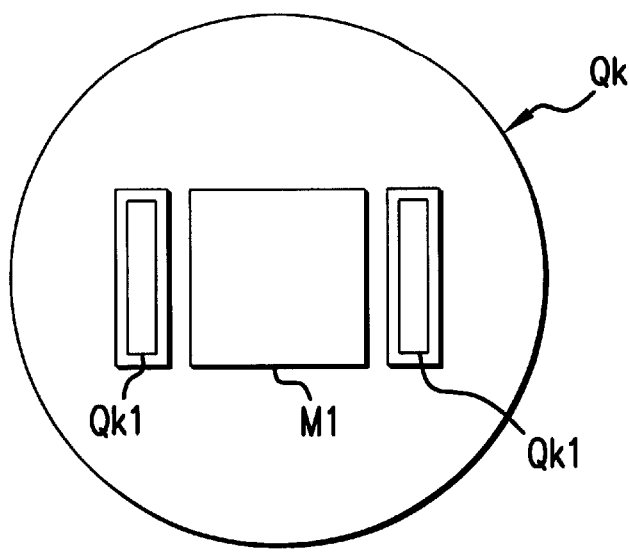
FIG. 6 is a front view showing an index plate which is employed in the projection exposure apparatus shown in FIG. 1.

As shown in FIG. 6, index plate Qk is a glass body (flat plate) which is provided with index marks Qk1 which are darkening parts, and as explained in the "Background Art" section, this serves as a reference when detecting the position of the image of the index mark Qk1 on the index plate Qk and the position of the image formed by light emitted from the alignment mark A on substrate W and transmitted by the phase plate q2. The setting is such that the light from alignment mark A passes through the rectangular region MI in FIG. 6. Furthermore, index plate Qk is disposed in a plane which is essentially conjugate with the focal plane of the objective lens Q1g described above within the imaging optical part Q2.

Furthermore, an index plate illumination system Qk2 which serves the purpose of dedicated illumination is provided at the index plate Ok. This index plate illumination system Qk2 comprises a light source Qk21, a condenser lens Qk22, an index plate illumination field stop Qk23, and a relay lens Qk24. The light emitted from light source Qk21 passes through the structural elements described above and is set so as to illuminate only the pair of index marks Qk1 on index plate Qk via the beam splitter Q2b which is provided in the optical axis QX. The index plate illumination system Qk2 described above is not absolutely necessary. In the case where this system is not provided, for example, light which directly enters from the substrate W (reflected light) may be employed as the light which illuminates the index plate Qk in an unchanged manner.

Returning to FIG. 2, the imaging light limiting stop Q2d is disposed in a plane having a conjugate relationship with the phase plate q2 described above. By means of this, it is possible to freely modify the numerical aperture (N.A.) of the imaging optical part Q.

The image pickup element Qc receives reflected light from substrate W which passes through the imaging optical part Q described above and receives light from the index marks Qk1 of the index plate Qk, recognizes this as an image (images) and converts this to a digital signal. A CCD camera, an area image sensor, or the like, is commonly employed for this.

Next, the image processing part Q3 will be described. This image processing part Q3 processes the electrical signals emitted by the image pickup element Qc, and outputs control signals which move the stage S in order to realize alignment. This image processing part Q3 comprises an amplifier Q31, an A/D converter Q32, an alignment controller (controlling unit) Q33, and a baseline memory (storage unit) Q34. Among these, the alignment controller Q33 and the baseline memory Q34 function as a baseline correcting device which conducts the actual correction of the baseline.

Amplifier Q31 is provided in order to amplify, by a desired amplification ratio, the electrical signal based on the image recognized in the image pickup element Qc, that is to say, the alignment mark detection signal. The amplification ratio at this time is fundamentally freely selected; depending on the state of the strength of the electrical signal of the incorporated image (the amplitude, the signal to noise ratio and the like) it is possible to carry out modification of the amplification factor in an appropriate fashion. In other words, in the present embodiment, this amplifier Q31 corresponds to the second modification device which modifies the electrical circuit characteristics, and moreover, conducts the modification of the detection conditions of the positional detection optical system Q.

The A/D converter Q32 is provided in order to convert the electrical signal amplified above from an analog signal to a digital signal. The alignment controller Q33 is provided in order to arithmetically process the digital signal outputted from the A/D converter Q32. Concretely, the positions of the image resulting from the reflected light from the alignment mark A on substrate W and the image of the index marks Qk1 of the index plate Qk are compared to one another, and inputting the position of the stage S as detected by a laser interferometer LC described hereinbelow, the position of the alignment mark A on substrate W is detected. Furthermore, the alignment controller Q33 conducts alignment based on the position detected. Additionally, the alignment controller Q33 conducts data exchange among the illumination light limiting member q1, phase plate q2, and amplifier Q31 described above. Concretely, the controller transmits, to the illumination light limiting member q1 and to the phase plate q2, data relating to the insertion or withdrawal state from the optical axis, and transmits, to amplifier Q31, data relating to the amplification factor. In addition to this, the alignment controller Q33 is connected with a baseline memory Q34 which is described hereinbelow, and conducts the writing and readout of data in this memory Q34.

Baseline memory Q34 is a memory which serves to store baseline correction values generated as a result of the modification of the optical characteristics or the electrical circuit characteristics of the positional detection optical system Q. Furthermore, this baseline memory Q34 is a region which stores baseline amounts measured by the positional detection optical system Q when modifications are not undergone by the optical characteristics modification device or the electrical circuit characteristics modification device.

Above, the details of the structure of the position optical detection mechanism Q were discussed; however, in addition, a projection optical system P and a stage S and the like are provided in the present embodiment. These are the same as those which where explained in the "Background Art" section above. As is shown in FIG. 1, a reticle R is disposed on the object surface side of projection optical system P, and the pattern surface thereof is transferred by exposure illumination light (exposure beam) by means of an illumination optical system which is not depicted in the figure. The illumination optical system employs, as the exposure illumination light, beams generated by a mercury lamp (for example, g line, i line), or higher harmonics or the like of KrF excimer lasers (wavelength 248 nm), ArF excimer lasers (wavelength 193 nm), $F_2$ lasers (wavelength 157 mn), or YAG lasers or metal vapor lasers. In projection optical system P, a plurality of refraction optical elements are lined up along the optical axis, and these reduce the image of the pattern of reticle R and project it onto substrate W. The projection optical system P may be a reflection-refraction optical system, in which a plurality of reflection optical elements, including mirrors or concave mirrors having a reflecting surface which is non-spherical, are combined with a plurality of refraction optical elements. In the present embodiment, the projection optical system P has a circular field of view and is a double-sided telecentric reducing system. Reticle R is supported by a reticle stage (not depicted in the figure) which is disposed at the object side thereof so that the pattern surface thereof is disposed in a first plane (object plane) which is perpendicular to the optical axis PX of the projection optical system P.

An alignment optical system RA is disposed above reticle R; this receives the light which is emitted from the reference mark FM on index plate PT which disposed at stage S as a result of the illumination of the exposure illumination light and which passes through the projection optical system P, as well as the light which is emitted from the reticle marks Rm, in an image pickup element (CCD) via an objective optical system, and detects the amount of positional displacement of the images of the two marks. This alignment optical system RA is employed during the baseline measurement described hereinbelow, and the measurement operation is the same as that explained in the case of FIG. 11.

A stage S, which supports substrate W and which is capable of two-dimensional movement within a plane perpendicular to the optical axis PX of the projection optical system P, is disposed at the image surface side of projection optical system P, and the position thereof is constantly measured by a laser interferometer LC. The substrate W is supported by the stage S within the view field of projection optical system P, that is to say, within the illumination region of the exposure illumination light, so that the exposure plane (for example, the surface) of the substrate W is disposed within a second plane (image plane) which is perpendicular to the optical axis PX. A reference plate PT is provided on stage S, and a reference mark FM which is employed during baseline measurement is formed on the reference plate PT. The reference mark FM contains two groups of line and space patterns having periodicities in the X and Y directions. The output signal of the laser interferometer LC is inputted into the alignment controller Q33 and into the main control apparatus Z which conducts all control of the entirety of the exposure apparatus. The alignment controller Q33 detects the position (coordinate values) of the alignment mark A on substrate W and the reference mark FM as described above, and the main control apparatus Z controls the drive of the stage S via a stage drive system which is not depicted in the figure, based on the position determined and the output of laser interferometer LC, and executes the alignment and the like of the shot region on the substrate W and the pattern image of the reticle R.

Figure 7:
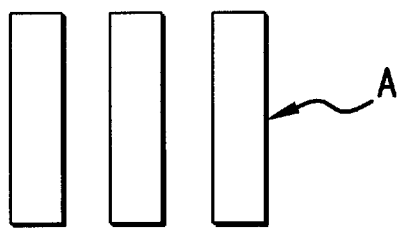
FIGS. 7 and 8 show alignment marks provided on a substrate.
Figure 8:
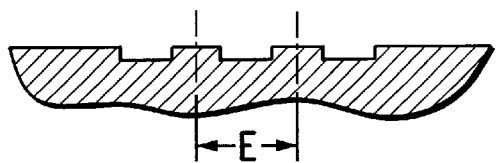

A mark comprising three band-shaped concavities disposed with a period of E, an example of which is shown in FIGS. 7 and 8, may be used as the alignment mark A which is provided on substrate W. As described above, this alignment mark A is provided in order to conduct a comparison of the relative positions with the index mark Qk1 in positional displacement optical system Q, and to calculate the correct position of stage S. In other words, by considering the relative distance between the image of index mark Qk1 and the image of alignment mark A in image pickup element Qk, it is possible to conduct alignment.

The functional results of a projection exposure apparatus 1 having the structure described above will now be explained. The essential feature of the present embodiment is the measurement of the baseline amount, so that an explanation of the details of the remainder of the exposure operation will be omitted. When the alignment mark A on substrate W is detected by positional detection optical system Q and a predetermined correction amount (offset) is added to the positional information (coordinate values) outputted by the alignment controller Q33, and stage S is moved, the image of reticle mark Rm projected by projection optical system P is essentially in agreement with the alignment mark A. This correction amount is the baseline amount referred to above.

Figure 9:
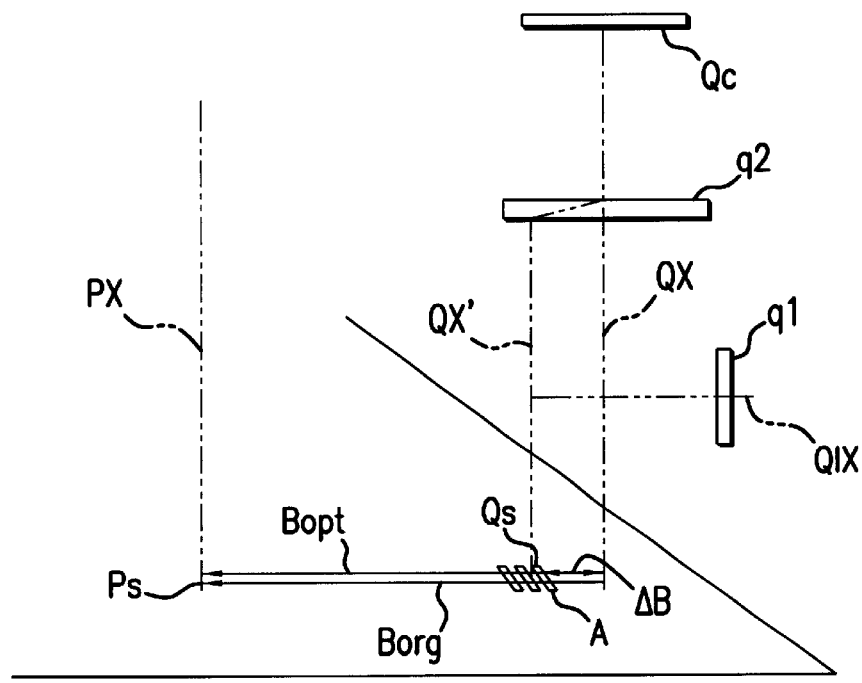
FIG. 9 is an explanatory diagram showing the state in which baseline correction is measured.
Figure 10:
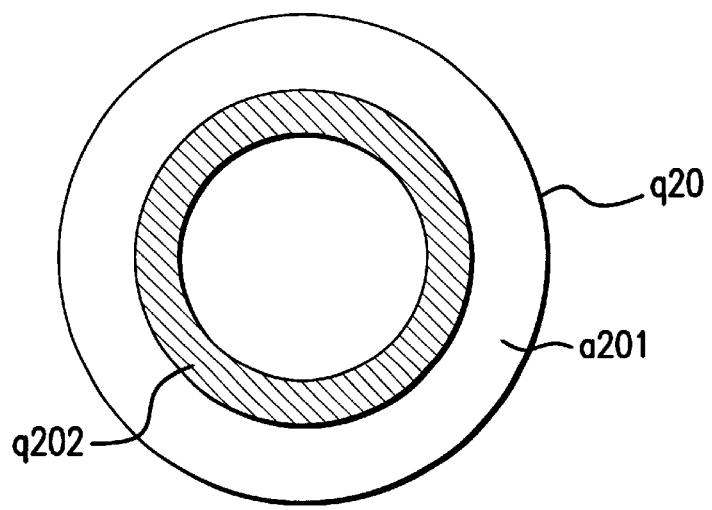
FIG. 10 is a front view of an imaging light limiting member which is an example of a member which modifies the optical characteristics which may be employed in the projection exposure apparatus in place of the phase plate shown in FIG. 4.

First, in positional detection optical system Q, when illumination light limiting member q1 and phase plate q2 are not disposed on optical axes Q1X and QX, and when the amplifier Q31 has a fixed amplification factor, as shown in FIG. 9, the baseline amount is calculated, and this is designated Borg. In other words, this baseline amount Borg is the baseline amount of the initial state of the optical characteristics and electrical circuit characteristics in the positional detection optical system Q. This baseline amount Borg is stored in baseline memory Q34.

Next, the baseline amount is measured in a case in which the illumination light limiting member q1 and the phase plate q2 are disposed in the respective optical axes Q1X and QX, and this is designated Bopt. The baseline memory Q34 stores this Bopt. As shown for example in FIG. 9, this baseline amount Bopt is in a state in which there is a difference of only $\Delta B$ (not equal to 0) from the baseline amount Borg described above. That is to say, $\Delta B$ corresponds to the correction value (detection error) of the baseline amount with respect to Borg. In FIG. 9, by inserting the illumination light limiting member q1 and the phase plate q2, the optical axis QX is apparently shifted to the optical axis QX', and even if the image of the alignment mark A is correctly detected in image pickup element Qc, the appropriate baseline amount is not Borg, but Bopt.

With respect to the disposition of the illumination light limiting member q1 in the optical path Q1X, in addition to the shift of the optical axis described above, the problem of aberration must also be considered. It is impossible to completely avoid the occurrence of such aberration; however, it is thought that the presence or absence of the illumination light limiting member q1 in the optical axis Q1X has an effect on the degree of such aberration. In other words, the disposition of the illumination light limiting member q1 in the optical axis Q1X, when compared with the case in which this member is not inserted into the optical path, changes the state of the light beam of the illumination optical system Q1 and this changes the illumination conditions of the alignment mark A, so that by means of this, the degree of aberration is thought to be larger (or smaller) in one or the other case. This has an effect on the image in the image pickup element Qc which comparable to the shift in optical axis QX described above. Accordingly, it is necessary to assume that the baseline amount Bopt described above incorporates the effects of the disparity of this aberration.

Furthermore, the amplifier Q31 is set in advance to a freely selected amplification factor which is arithmetically selected (modification of the electrical circuit characteristics) and in accordance with this, changes Bele1, Bele2 . . . in the baseline amount are measured and these are stored in advance in the baseline memory Q34. When the amplification factor of this amplifier Q31 is changed, modulation is applied to the electrical signal from the image pickup element Qc. For example, as the amplification factor increases, this tends to lead to a time delay and an increase in the necessary elements. As a result, in the alignment controller Q33, an image containing displacements such as horizontal or vertical shifts or the like, which differs from the signal distribution of the image actually observed in the image pickup element Qc, is observed. The changes Bele1, Bele2, . . . in the baseline amount described above correspond precisely thereto. If the difference from the Borg described above is obtained with respect to these baseline amounts Bele1, Bele2, . . . , as well, then in general, displacement amounts ΔB1, ΔB2, . . . , which are not 0 are present. These ΔB1, ΔB2, . . . correspond to correction values (detection errors) of the baseline amounts, in the same way as the ΔB described above. In this way, by storing correction values of the baseline amounts with respect to amplification factors, it is possible to know the appropriate baseline amount for each amplification factor.

When the alignment of substrate W is actually executed as described above, this is conducted in a state in which the various baseline values Borg, Bopt, Bele1, Bele2, . . . are stored in the baseline memory Q34. For example, if an alignment mark A provided on a conveyed substrate W is clearly discernible in a standard positional detection optical system Q (image processing part Q3), then alignment controller Q33 conducts alignment without inserting the illumination light limiting member q1 or the phase plate q2 into the optical axis by selecting baseline amount Borg from baseline memory Q34.

On the other hand, in the case where the alignment mark A is, for example, a low step mark as a result of a flattening process and the image in the image pickup element Qc is unclear (inappropriate for positioning), then attempts are made to insert the illumination light limiting member q1 and the phase plate q2 into the optical axis and modify the optical characteristics, or to adjust the amplification factor of amplifier Q31 and thus modify the electrical circuit characteristics or the like. If at this time the image of the alignment mark A becomes clear as result of, for example, modification of the optical characteristics, then data incorporating this modification of the optical characteristics are sent from the illumination light limiting member q1 and the phase difference q2 to the alignment controller q33, and based on these data, the alignment controller q33 selects the baseline amount Bopt from the baseline memory Q34 and conducts the alignment of substrate W. This processing method is applied in exactly the same manner in the case of a modification of the electrical circuit characteristics.

In this way, in accordance with the projection exposure apparatus of the present embodiment, with respect to changes in the optical characteristics and electrical circuit characteristics in the positional detection optical system Q, the baseline amounts Borg, Bopt, Bele1, Bele2, . . . are measured in advance, and these are stored in advance in the baseline memory Q34, and thereby, alignment controller Q33 selects the appropriate baseline amount from among the baseline amounts Borg, Bopt, Bele1, Bele2, and the like based on the changes in the characteristics, and conducts alignment, so that appropriate exposure is always executed. This means that the manufacture of products having stable quality is possible without suffering the effects of changes in the optical characteristics (reflectivity, diffraction and the like) or shape of the alignment mark A provided on the substrate W. In the embodiment described above, each time optical characteristics and electrical circuit characteristics were combined, the corresponding baseline amount or the correction value thereof was stored; however, a function expressing the relationship between the combination of optical characteristics and electrical circuit characteristics and the corresponding amount of fluctuation in the baseline amount may be stored in advance in the memory, and the baseline amount or the amount of fluctuation thereof (in other words, the correction value) may be calculated based on the selected combination of characteristics and the function which is stored for this combination when the alignment mark is detected.

As described in the embodiment above, the present invention is not limited to a form in which alignment is conducted by storing baseline amounts Borg, Bopt, Bele1, Bele2, . . . corresponding to the various changes in characteristics, in baseline memory Q34. For example, the following type of alignment may be conducted. As shown in FIG. 1, the modification of the optical characteristics described above, that to say, the insertion of illumination light limiting member q1 and phase plate q2 into the optical axes, is conducted by movable members q13 and q21. Accordingly, when the members q1 and q2 are inserted into the optical axes, it can be inferred that there will be some physical displacement resulting from errors in attachment to the moveable members q13 and q21 or from errors in movement thereof during insertion. This physical displacement is generally impossible to predict in advance, so that in cases of processing of products which require particular accuracy, it is preferable that instead of selecting Bopt during the modification of the optical characteristics, exposure be conducted while measuring the baseline amount for each modification of the characteristics. In other words, in the detection of the alignment mark A in semiconductor W, in cases corresponding to modifications of the optical characteristics of the positional detection optical system Q when the image is unclear, exposure is conducted after measuring the baseline amount each time.

The circumstances described above are the same in modifications of the electrical circuit characteristics in the positional detection optical system Q, that is to say, in the case of the modification of the amplification factor of the amplifier Q31, and thereby, in these cases as well, it is possible to measure the baseline amount for each modification of the characteristics and to conduct exposure operations.

If alignment is conducted by measuring the baseline amount for each set of characteristics in this manner, then in comparison with operations in which the baseline memory Q34 is employed as described above, alignment may be conducted more reliably and with higher accuracy. However, in these cases, the throughput naturally falls, so that the choice of which method to employ in conducting exposure is determined in view of the conditions and the accuracy and the like required in the products.

Furthermore, when the baseline is measured in the embodiment described above, the reference mark FM formed on the reference plate PT on stage S is detected in the manner of a time series with, respectively, the alignment optical system RA and the positional detection optical system Q. However, as disclosed, for example, in Japanese Patent Application, First Publication No. HEI 4-324923 and the corresponding U.S. Pat. No. 5,243,195, first and second reference marks PT are formed separated by an interval corresponding to the baseline amount of the positional detection optical system Q of the off-axis type, and simultaneously with the detection of the first reference mark by the alignment optical system RA, the second reference mark is detected by the positional detection optical system Q. Then, the baseline amount may be determined based on the detection results of the two optical systems, the measured result of the interferometer LC, and the interval between the first and second reference marks. By means of this, it is possible to conduct baseline measurement without removing the stage S, so that it is possible to shorten the measurement time, and to increase the accuracy of measurement. This disclosure and the disclosure of the United States patent are incorporated in the disclosure of the present document insofar as this is permitted by the domestic law of the countries designated in the present international application or countries which are selected.

With respect to the embodiment explained above, supplementary items are discussed hereinbelow.

First, an illumination light limiting member q1 and a phase plate q2 were provided in the above embodiment as the modification device for the optical characteristics in the positional detection optical system Q; however, the present invention is not particularly limited to this structure. For example, in place of the phase plate q2, it is possible to employ an illumination light limiting member q20 such as that shown in FIG. 10. Herein, an annular-shaped darkening part Q202 is formed in the flat plate comprising a transparent body q201. As is clear from this figure, the imaging light limiting member q20 is not outwardly greatly different from the phase plate q2. However, the darkening part q202 is formed at a position which does not allow the passage of the zero-order diffracted light among the light emitted from the substrate W. In other words, in the same way as in the fundamental principle of the so-called dark field microscope, only the first order or higher diffracted light is transmitted. By means of this type of imaging light limiting member q20, it is possible to obtain clear images even in cases in which the step of the alignment mark A is particularly small. Even in the case in which this imaging light limiting member q20 is inserted into the optical path QX, the light beams pass through the transparent body q201, so that it is quite possible that this will cause dislocation or the like of the optical axis QX. Accordingly, even in the case of a positional detection optical system Q which is provided with this type of imaging light limiting member q20, by applying a projection exposure apparatus 1 in accordance with the present invention, it is possible to obtain suitable results.

The modification of the optical characteristics is not necessarily limited to the form described above; even in the case in which the illumination light source Q1a of the illumination optical system Q1 in the positional detection optical system Q, that is to say, the intensity distribution of the illumination light (the shape or size of the secondary light source) in the pupil plane of the illumination optical part Q1, is modified, it is of course possible to modify the optical characteristics. In this case, as well, it is clear that if baseline correction is conducted in accordance with the present embodiment, reliable exposure may be conducted.

In the present embodiment, the modification of the electrical circuit characteristics in the positional detection optical system Q was conducted by an increase or decrease in the amplification ratio of the amplifier Q31; however, the modification of the electrical circuit characteristics is not limited to this method. For example, in the image processing part Q3 shown in FIG. 1, a noise filter or the like may be added into the circuitry in order to increase the reliability of the detection signal; however, this may also be used to modify the electrical circuit characteristics. In this case when this noise filter is inserted into the circuitry, and when the noise filter is not present in the circuitry, the measurement of the baseline amount and the correction values may be stored in advance in the baseline memory Q34.

Additionally, with respect to calculations in which the alignment controller Q33 and the baseline memory Q34 are concerned, in the case of the embodiment described above, the baseline amounts Borg, Bopt, Bele1, Bele2, . . . are directly stored, and the alignment controller Q33 selects each baseline amount for each modification of the characteristics. However, the calculation processing is not necessarily limited to this form, and for example, the differences between Borg and the other baseline amounts Bopt, Bele1, Bele2, . . . may be stored in baseline memory Q34 as ΔB, ΔB1, ΔB2, . . . , and a processing method may be adopted in which the accurate baseline amounts are obtained by adding or subtracting these to or from Borg.

Furthermore, in the embodiment described above, in addition to the projection optical system P, a separate offset-type positional detection optical system Q, in which a objective optical system was disposed, was employed; however, a positional detection optical system of the TTL (Through The Lens) type, in which illumination light is irradiated onto the alignment mark on substrate W via the projection optical system P and the light which is emitted from the mark and passes through the projection optical system P is received, or a positional detection optical system of the TTR (through the reticle) type, in which the alignment mark on the substrate and the alignment mark on the reticle are detected via the projection optical system P, may be employed.

Furthermore, even in the case in which a positional detection optical system which conducts the image pickup of the alignment mark is not employed, but rather a positional detection optical system is employed in which, for example, two coherent beams are irradiated onto the alignment mark on the substrate, and the diffracted light emitted in essentially the same direction from the mark is received, or in the case in which a positional detection optical system is employed in which the plus or minus one order diffracted light which is generated from the alignment mark by the irradiation of the coherent beams and which passes through the projection optical system P is irradiated onto the reticle mark, and two diffracted light beams emitted from the reticle marks are received, it is desirable to calculate the baseline amount or the correction values for each set of characteristics, in the same way as in the present embodiment, when the optical characteristics or the electrical characteristics of the positional detection optical system are modified in accordance with a modification of the formation conditions of the alignment mark (the pitch or the like). That is to say, the present invention may be applied with respect to the positional detection optical system irrespective of the type of detection of the alignment mark, and is capable of obtaining the same effects in all cases.

Furthermore, the positional detection optical system described above is capable of application not merely to reduction projection type exposure apparatuses of the step and repeat type (steppers) or reduction projection type scanning exposure apparatuses of the step and scan type (scanning steppers) but also to all exposure apparatuses, including proximity types and mirror projection types. Furthermore, the positional detection optical system of FIG. 1 may be applied with respect to exposure apparatuses which employ hard X-rays or charged particle beams (electron beams or ion beams or the like), or to exposure apparatuses which employ light having oscillation spectra within a range of 5 to 15 nm (the soft X-ray band), such as, for example, EUV (extreme ultraviolet) light having a wavelength of 13.4 nm or 11.5 nm. Projection exposure apparatuses which employ EUV light are provided with a reduction projection optical system which prescribes the illumination regions on a reflection mask using arc slits and which comprises a plurality of reflection optical elements (mirrors), and the reflection mask and the substrate are moved simultaneously at a velocity ratio which is in accordance with the magnification factor of the reducing projection optical system, and thus the pattern on the reflection on the reflection mask is transferred onto the substrate.

In the embodiment described above, the baseline amount was corrected in accordance with the modification of the detection conditions (optical characteristics, electrical circuit characteristics and the like) of the alignment mark by means of the positional detection optical system; however, the detection error of the alignment mark produced as a result of the modification of the detection conditions may be added as an offset to the positional information (the coordinate values on an orthogonal coordinate system XY defined by an interferometer LC, or the amount of positional displacement from the reference mark Qk1) of the alignment mark detected by the positional detection optical system Q. Alternatively, so that the amount of fluctuation in the baseline amount (the detection error in the alignment mark) produced by the modification of the detection conditions is canceled out, the exposure position of the reticle R may be modified in accordance with this amount of fluctuation (detection error). In other words, in the static exposure method, the stoppage position of the reticle R may be shifted, while in the scanning exposure method, the scanning exposure (or acceleration) initiation position of the reticle R may be shifted. In short, the exposure position of substrate W with respect to reticle R should be corrected in accordance with the modification of the detection conditions, and any of the baseline amount of the positional detection optical system Q, the positional information of the alignment mark detected by the positional detection optical system Q, or the exposure position of reticle R, may be corrected. Furthermore, the exposure position of the substrate W is determined by the baseline amount and the positional information of the alignment mark, so that in the present invention, at least one of the exposure position of the substrate W and the exposure position of the reticle R, that is to say, the relative exposure position data of the substrate W and the reticle R, is corrected in accordance with the modification of the detection conditions of the positional detection optical system Q.

Furthermore, the projection optical system PL is not limited to a refraction system comprising a plurality of refraction optical elements; a reflection-refraction system having refraction optical elements and reflection optical elements (concave mirrors or the like), or a reflection system comprising solely a plurality of reflection optical elements, may be employed. Here, as the reflection-refraction type projection optical system, there are optical systems which are provided with at least a beam splitter and concave mirror reflection optical elements, optical systems which are provided with no beam splitters, but are provided with concave mirrors and mirrors as reflection optical elements, and optical systems which, as disclosed in U.S. Pat. No. 5,788,229, have two reflection optical elements (at least one of which is a concave mirror) and a plurality of refraction optical elements disposed along a single optical axis. The disclosure of this United States patent is incorporated by reference into the disclosure of the present document insofar as this is permitted by the domestic law of the countries designated in the present international application, as well as selected countries. Furthermore, the projection optical system P may be an enlarging type, a reducing type, or a non-magnifying type. Furthermore, the present invention may be applied even if a projection optical system is not employed, such as, for example, in proximity type exposure apparatuses.

Furthermore, in place of an extra-high pressure mercury lamp, an excimer laser, or an $F_2$ laser or the like, it is also possible to employ higher harmonics in which a single-wavelength laser in the infrared band or the visible band is oscillated from an DFB semiconductor laser or a fiber laser and is amplified by a fiber amplifier doped with erbium (or with both erbium and ytterbium), and this is frequency-converted to ultraviolet light using non-linear optical crystals. As an example of this, if the oscillation wavelength of the single-wavelength laser is set to a range of 1.51 to 1.59 micrometers, then the eightfold higher harmonic, the generation wavelength of which is within a range of 189 to 199 nm, or the tenfold higher harmonic, the generation wavelength of which is within a range of 151 to 159 nm, is outputted. In particular, if the oscillation wavelength is set within a range of 1.544 to 1.553 micrometers, then the eightfold higher harmonic, within a range of 193 to 194 nm, that is to say, ultraviolet light having a wavelength which is essentially the same as that of a ArF excimer laser, is obtained, and if the oscillation wavelength is within a range of 1.57 to 1.58 micrometers, then the tenfold higher harmonic within a range of 157 to 158 nm, that is to say, ultraviolet light having a wavelength which is essentially the same as that of a $F_2$ laser, is obtained.

The present invention is not limited to the production of microprocessors such as semiconductor elements and the like; it may be applied in exposure apparatuses which transfer a circuit pattern onto a glass substrate or a silicon wafer or the like in order to produce reticles or masks used in, for example, light exposure apparatuses, EUV exposure apparatuses, X-ray exposure apparatuses, or electron beam exposure apparatuses or the like. Here, transmission type reticles are commonly employed in exposure apparatuses which use DUV (distant ultraviolet) or VUV (vacuum ultraviolet) light, and the reticle substrates employed include silica glass, fluorine-doped silica glass, quartzite, magnesium fluoride, liquid crystal, or the like. Furthermore, transmission type masks (stencil masks, membrane masks) are employed in proximity type exposure apparatuses and electron beam apparatuses and the like; silicon wafers and the like are employed as mask substrates.

Furthermore, it is possible to manufacture the exposure apparatus of the embodiment described above by incorporating the illumination optical system and the projection optical system comprising a plurality of optical elements into a exposure apparatus main body and conducting optical adjustment, attaching a reticle stage or wafer stage comprising a plurality of mechanical parts to the exposure apparatus main body and connecting these using wiring or piping, and furthermore conducting overall adjustment (electrical adjustment, operational confirmation and the like). It is desirable that the manufacture of the exposure apparatus be conducted within a clean room in which the temperature and degree of cleanliness are regulated.

Furthermore, the semiconductor device is manufactured via a step in which the design of the function and characteristics of the device is conducted, a step in which, based on the design step, a reticle is produced, a step in which wafers are produced from silicon material, a step in which the pattern of the reticle is exposed onto the wafers by the exposure apparatus of the embodiment described above, a step in which the device is assembled (including a dicing process, a bonding process, and packaging process) and a testing step and the like.

INDUSTRIAL APPLICABILITY

The present invention provides a technology for making it possible, in a projection exposure apparatus, to correct the baseline amount in correspondence with changes in characteristics, and to execute reliable alignment, even when the characteristics of the positional optical system are caused to change. Furthermore, in the exposure method, a technique is provided which allows a reticle pattern to be transferred in an overlapping manner onto circuit patterns (shot regions) formed on a substrate in a constant and accurate manner even when the mark detection conditions of the positional detection optical system are modified in an exposure method.

What is claimed is:

1. An exposure apparatus which detects a mark on a substrate by a positional detection optical system, adjusts a positional relationship between said substrate and a mask based on a baseline amount and the results of the detection, and projection-exposes an image of a pattern on said mask onto said substrate through a projection optical system, said exposure apparatus comprising:
    a first modification device that modifies optical characteristics of said positional detection optical system; and
    a baseline correction device that is electrically connected to said first modification device and corrects said baseline amount in correspondence with the modification of said optical characteristics by said first modification device.

2. An exposure apparatus in accordance with claim 1, wherein at least one of a phase plate and a partial shielding plate which may be inserted into or withdrawn from an optical axis of said positional detection optical system is employed as said first modification device.

3. An exposure apparatus in accordance with claim 1, wherein said baseline correction device measures said baseline amount after modification based on the modification of the characteristics by said modification devices.

4. An exposure apparatus in accordance with claim 1, wherein said baseline correction device comprises a storage unit that stores in advance correction values of each baseline amount based on the modification of said characteristics by said modification devices, and a control unit that detects modification by said modification devices and extracts said correction value corresponding to this modification from said storage unit.

5. An exposure apparatus in accordance with claim 1, further comprising:
    a signal processing system that is connected to said positional detection optical system; and
    a second modification device that modifies electrical circuit characteristics of said signal processing system;
    wherein said baseline correction device corrects said baseline amount in correspondence with at least one of the modification of said optical characteristics and the modification of said electrical circuit characteristics.

6. An exposure apparatus in accordance with claim 5, wherein said second modification device modifies an amplification factor of a mark detection signal.

7. An exposure apparatus which detects a mark on a substrate by a positional detection optical system, and projection-exposes the image of a pattern on a mask onto a substrate through a projection optical system after adjusting positions of said substrate and said mask based on a baseline amount and the results of this detection, said projection exposure apparatus comprising:
    a modification device that modifies electrical circuit characteristics of said positional detection optical system; and
    a baseline correction device that is electrically connected to said modification device and corrects said baseline amount in correspondence with the modification of said electrical circuit characteristics by said modification device.

8. An exposure apparatus in accordance with claim 7, wherein said modification device modifies an amplification factor of a mark detection signal.

9. An exposure apparatus in accordance with claim 7, wherein said baseline correction device measures said baseline amount after modification based on the modification of the characteristics by said modification device.

10. An exposure apparatus in accordance with claim 7, wherein said baseline correction device comprises a storage unit that stores in advance correction values of each baseline amount based on the modification of said characteristics by said modification device, and a control unit that detects modification by said modification device and extracts said correction value corresponding to this modification from said storage unit.

11. An exposure method in which a mark formed on a substrate is detected by a mark detection system, the relative positions of a substrate and an exposure beam are adjusted based on the results of the detection, and said substrate is exposed by said exposure beam, said exposure method comprising:
    modifying the detection conditions of said mark on said substrate by said mark detection system; and
    in accordance with the modification of said detection conditions, correcting the information regarding relative positions of said substrate and said exposure beam.

12. An exposure method in accordance with claim 11, wherein, in order to compensate for fluctuations in a baseline amount of said mark detection system due to said detection error generated by the modification of said detection condition, said baseline amount of said mark detection system employed in the adjustment of the relative positions of said substrate and said exposure amount exposure beam in correspondence with detection conditions after modification, is corrected.

13. An exposure method in accordance with claim 11, wherein the baseline amount of said mark detection system is determined in advance for each set of detection conditions, including detection error produced as a result of modification of said detection conditions, and after modification of said detection conditions, adjustment of said relative positions is conducted based on baseline amounts corresponding to said detection conditions.

14. An exposure method in accordance with claim 11, wherein said detection conditions are modified in accordance with at least one of a type of said substrate, a type of a resist applied on said substrate, and formation conditions of said mark.

15. An exposure method in accordance with claim 11, wherein said detection conditions includes optical characteristics of said mark detection system.

16. An exposure method in accordance with claim 15, wherein said optical characteristics include at least one of an intensity distribution of illumination light irradiated onto said mark on said substrate within said mark detection systerm, and imaging characteristics of light emitted from said mark by irradiation of said illumination light.

17. An exposure method in accordance with claim 11, wherein said detection conditions include electrical characteristics of said mark detection system.

18. An exposure method in accordance with claim 17, wherein said electrical characteristics include an amplification factor of electrical signals.

19. An exposure apparatus which comprises a mark detection system that detects a mark formed on a mask, adjusts the relative position of exposure beam and a substrate based on a detection result by said mark detection system, and exposes said substrate with said exposure beam, said exposure apparatus comprising:
 a modification device which is connected to s aid mark detection system and which modifies detection conditions of said mark by said mark detection system;
 a correction device which corrects relative positional information of said exposure beam and said substrate in accordance with the modification of said detection conditions.

20. An exposure apparatus in accordance with claim 19, wherein said detection conditions include at least one of optical characteristics and electrical circuit characteristics of said mark detection system.

21. An exposure apparatus in accordance with claim 19, wherein said detection conditions are modified in accordance with at least one of a type of said substrate, a type of a resist applied on said substrate, and formation conditions of said mark.

22. An exposure apparatus in accordance with claim 19, further comprising a projection optical system that projects a predetermined pattern formed on said mask onto said substrate, and wherein said mark detection system is an off-axis type mark detection system that detects said mark without using said projection optical system.

23. A projection exposure apparatus in accordance with claim 19, wherein, in order to compensate for the detection errors of said mark detection system produced by the modification of said detection conditions, said correction device corrects at least one of an exposure position of said mask and an exposure position of said substrate determined from a baseline amount of said mark detection system and positional information of said mark detected by said mark detection system.

24. A projection exposure apparatus in accordance with claim 23, wherein said correction device corrects said baseline amount of said mark detection system or said positional information of said mark.

25. An exposure method in which a substrate is exposed using energy beams irradiated onto a mask, comprising:
 modifying detection conditions of a mark by a mark detection system in accordance with formation conditions of said mark on said substrate; and
 correcting relative exposure positional information of said mask and said substrate based on said detection conditions after the modification.

26. An exposure method in accordance with claim 25, wherein reference marks are detected by, respectively, said mark detection system in which the detection conditions thereof are modified, and an alignment system which detects a mark on said mask, and said exposure positional information are corrected by determining a baseline amount of said mark detection system.

27. An exposure method in accordance with claim 25, wherein at least one of optical characteristics and electrical characteristics of said mark detection system is modified.

28. An exposure method in accordance with claim 25, wherein, in order to compensate for detection errors of said mark detection system produced by the modification of said detection conditions, at least one of an exposure position of said substrate determined from positional information of said mark detected by said mark detection system and a baseline amount of said mark detection system, and an exposure position of said mask, is corrected.

29. An exposure method in accordance with claim 28, wherein said baseline amount of said mark detection system or positional information of said mark are corrected.

30. A device manufacturing method comprising a step of transferring a device pattern on a mask onto a substrate using an energy beam irradiated on said mask, comprising:
 modifying detection conditions of a mark by a mark detection system in accordance with formation conditions of said mark on said substrate; and
 correcting relative exposure positional information of said mask and said substrate based on said detection conditions after the modification.

31. A device manufacturing method in accordance with claim 30, wherein at least one of an optical characteristic and an electrical characteristic of said mark detection system is modified.

32. A device manufacturing method in accordance with claim 30, wherein, in order to compensate for detection errors of said mark detection system produced by the modification of said detection conditions, at least one of an exposure position of said substrate determined from positional information of said mark detected by said mark detection system and a baseline amount of said mark detection system, and an exposure position of said mask, is corrected.

33. A device manufacturing method in which a mark formed on a substrate is detected by a mark detection system, relative positions of said substrate and an exposure beam are adjusted based on results of a detection made by the mark detection system, and device patterns are transferred onto said substrate by exposing said substrate by said exposure beam, said device manufacturing method comprising:

modifying the detection conditions of said mark on said substrate by said mark detection system; and correcting the information regarding the relative positions of said substrate and said exposure beam in accordance with the modification of said detection conditions.

34. A device manufacturing method in accordance with claim 33, wherein said detection conditions include optical characteristics of said mark detection system.

35. A device manufacturing method in accordance with claim 33, wherein, in order to prevent fluctuation in a baseline amount of said mark detection system due to a detection error generated by the modification of said detection conditions, said baseline amount of said mark detection system employed in the adjustment of the relative position of said substrate and said exposure amount of the exposure beam in correspondence with detection conditions after modification, is corrected.

36. A device produced by a method comprising a step of transferring a device pattern formed on a mask onto a substrate using an exposure apparatus, said exposure apparatus comprising:

a positional detection optical system which detects a mark formed on said substrate;

a position adjusting device which adjusts a positional relationship between said substrate and said mask based on a baseline amount and the results of the detection;

a projection optical system which projects an image of a pattern on said mask onto said substrate;

a modification device which modifies optical characteristics of said positional detection optical system; and a baseline correction device which is electrically connected to said modification device and corrects said baseline amount in correspondence with the modification of said optical characteristics by said modification device.

37. A device according to claim 36, wherein at least one of a phase plate and a partial shielding plate which may be inserted into or withdrawn from an optical axis of said positional detection optical system is employed as said modification device.

38. A device according to claim 36, wherein, in said exposure apparatus, said baseline correction device measures said baseline amount after modification based on the modification of the optical characteristics by said modification device.

39. A device produced by a method comprising a step of transferring a device pattern formed on a mask onto a substrate using an exposure apparatus, said exposure apparatus comprising:

a positional detection system which detects a mark on said substrate;

a position adjusting device which adjusts positions of said substrate and said mask based on a baseline amount and the results of the detection by said positional detection system;

a projection optical system which projection-exposes an image of said device pattern on said mask onto said substrate;

a modification device which modifies electrical circuit characteristics of said positional detection optical system; and a baseline correction device which is electrically connected to said modification device and corrects said baseline amount in correspondence with the modification of said electrical circuit characteristics by said modification device.

40. A device according to claim 39, wherein, in said exposure apparatus, said modification device modifies an amplification factor of a mark detection signal.

41. A device produced by a method comprising a step of transferring a device pattern onto a substrate using an exposure apparatus, said exposure apparatus comprising:

a mark detection system which detects a mark formed on said mask;

a position adjusting device which adjusts a relative position of an exposure beam and said substrate based on a detection result by said mark detection system;

a modification device which is connected to said mark detection system and which modifies detection conditions of said mark by said mark detection system; and a correction device which corrects relative positional information of said exposure beam and said substrate in accordance with the modification of said detection conditions.

42. A device in accordance with claim 41, wherein, in order to compensate for detection errors of said mark detection system produced by the modification of said detection conditions, in said exposure apparatus, said correction device corrects at least one of (i) an exposure position of said mask and an exposure position of said substrate determined from a baseline amount of said mark detection system, and (ii) positional information of said mark detected by said mark detection system.

43. A device in accordance with claim 41, wherein, in said exposure apparatus, said detection conditions include at least one of an optical characteristic and an electrical circuit characteristic of said mark detection system.

* * * * *